United States Patent [19]

Jin et al.

[11] Patent Number: 4,785,244

[45] Date of Patent: Nov. 15, 1988

[54] MAGNETO-ELECTRIC SENSOR DEVICE AND SENSING METHOD USING A SENSOR ELEMENT COMPRISING A 2-PHASE DECOMPOSED MICROSTRUCTURE

[75] Inventors: Sungho Jin, Millington; Richard C. Sherwood, New Providence; Thomas H. Tiefel, Piscataway; Robert B. van Dover, Gillette, all of N.J.

[73] Assignee: American Telephone and Telegraph Company, AT&T Bell Laboratories, Murray Hill, N.J.

[21] Appl. No.: 36,196

[22] Filed: Apr. 8, 1987

Related U.S. Application Data

[63] Continuation of Ser. No. 676,537, Nov. 30, 1984, abandoned.

[51] Int. Cl.$^4$ .................... G01R 33/00; H02M 5/10; A61N 1/00
[52] U.S. Cl. ........................ 324/260; 128/429 F; 307/419
[58] Field of Search .................. 324/260, 207, 208; 128/419 F; 307/419; 72/419; 148/12 A, 100, 120–122

[56] References Cited

U.S. PATENT DOCUMENTS

3,602,906  8/1971  Wiegand .................. 307/419
3,783,880  11/1974 Kraus ...................... 128/419 F
4,251,293  2/1981  Jin ........................... 148/120

Primary Examiner—Reinhard J. Eisenzopf
Assistant Examiner—Walter E. Snow
Attorney, Agent, or Firm—Peter A. Businger

[57] ABSTRACT

Devices such as, e.g., switches, flowmeters, and proximity sensors, as well as implant devices are made comprising an elongated ferromagnetic element. When the element is exposed to a variable magnetic field an electrical signal is obtained between contact points of the element in response to a change in the magnetic field. Preferred elongated elements have a helically deformed microduplex structure as may be produced by heat treatment and plastic twisting of a body of an alloy such as, e.g., an iron-nickel alloy.

10 Claims, 1 Drawing Sheet

MAGNETO-ELECTRIC SENSOR DEVICE AND SENSING METHOD USING A SENSOR ELEMENT COMPRISING A 2-PHASE DECOMPOSED MICROSTRUCTURE

This application is a continuation of application Ser. No. 676,537, filed Nov. 30, 1984, abandoned.

FIELD OF THE INVENTION

The invention is concerned with magneto-electric devices and their utilization.

BACKGROUND OF THE INVENTION

Magento-electric pulse generating devices play a role, e.g., as switches, flowmeters, tachometers, automotive ignition distributors, and proximity sensors in a variety of commercial and industrial applications. Among such devices are those based on an effect as disclosed, e.g., in U.S. Pat. No. 3,892,118, "Method of Manufacturing Bistable Magnetic Device", issued July 1, 1975 to J. R. Wiegand; disclosed there is a magnetic wire having a cylindrical, magnetically hard outer region and a magnetically soft core portion. Such a wire may be in one of two stable magnetic states, one in which magnetization in outer and inner portions is parallel, and the other in which such magnetizations are antiparallel. Switching between states is triggered by a suitable change in an ambient magnetic field, resulting in a large change of magnetic flux in the wire, and inducing a voltage pulse in a pickup coil.

An alternate approach is disclosed in papers by K. Mohri et al., "Sensitive Magnetic Sensors Using Amorphous Weigand-type Ribbons", *IEEE Transactions on Magnetics*, Vol. MAG-17, No. 6, November 1981, pp, 3370–3372, and "Sensitive Bistable Magnetic Sensors Using Twisted Amorphous Magnetostricture Ribbons Due to Matteucci Effect", *Journal of Applied Physics*, Vol. 53, No. 11, pp. 8386–8388. There, elastically twisted ribbons are used which are made of an amorphous magnetostrictive alloy and which produce a voltage between the ends of the ribbon.

SUMMARY OF THE INVENTION

An electrical signal is produced in a device in response to a change in a magnetic field. An elongated body of a ferromagnetic element serves as a sensor element having contact points between which an electrical signal is produced; the sensor element has a microstructure comprising elongated, substantially aligned particles which are helically arranged even in the absence of externally applied elastic stress. When implanted in an organism, elongated sensor elements which produce electrical signals between contact points in response to a change in a magnetic field can serve to produce internal electrical stimuli when an external magnetic field is varied.

DETAILED DESCRIPTION

Figure 1:
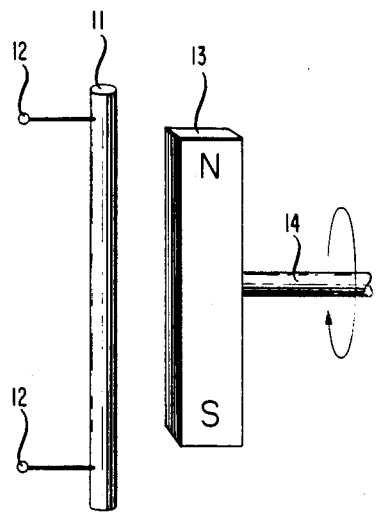
FIG. 1 schematically shows a frequency sensor device in accordance with an embodiment of the invention.
Figure 2:
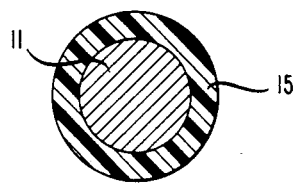
FIG. 2 shows in schematic cross section a sensor element 11 with coating 15.

FIG. 1 shows magneto-electric sensor element 11 with contacts 12, and permanent magnet 13 attached to drive shaft 14. Element 11 has elongated, substantially aligned and permanently present helical microstructure as may be conveniently produced by twisting of a rod or wire; such twisting is well past the elastic limit and results in permanent, plastic deformation upon release of elastic stress. As drive shaft 14 is rotated a train of electrical pulses is produced at contacts 12.

The material of element 11 is an alloy, and among alloys suitable for devices in accordance with the invention are iron-nickel alloys preferably comprising iron and nickel in a combined amount of at least 90 and preferably 98 weight percent of the alloy. The remainder may comprise additives such as, e.g., Mn, Cr for corrosion resistance, Co for enhanced magnetic properties, and impurities such as, e.g., Ti, V, Al, Si, Cu, Zn, Mo, Nb, Zr, B, W, and Ta. The combined amount of iron and nickel comprises nickel in a preferred amount in the range of from 2 to 18 weight percent and preferably from 3 to 15 weight percent.

Preferred processing comprises wire drawing, heat treatment resulting in two-phase decomposition, additional wire drawing, low temperature heat treatment resulting in elongated and aligned two-phase decomposed microstructure, and plastic twisting to produce helically aligned microstructure. Optionally, an additionaly step of stress annealing may be used to enhance stability under mechanical influences such as, e.g., elastic bending; this aspect may be particularly significant in biomedical applications where an implanted element is subjected to tissue pressure and other physiological effects.

Preferred wire drawing results in a cross-sectional area reduction of at least 50 percent; two-phase decomposition is effected at a temperature in a preferred range of from 400 to 700 degrees C. for a duration of from 2 minutes to 20 hours. Plastic twisting preferably results in permanently retained 0.1 to 10 turns per inch; such twisting may be in one sense only or alternating clockwise and counterclockwise. Stress relief annealing is typically effected at a temperature which is greater than or equal to 0.4 times the melting temperature of the alloy as expressed in degrees Kelvin, and for a preferred time which is greater than or equal to 15 minutes.

Processed alloys have a microduplex structure comprising elongated and aligned particles. Such structure is preferred in that plastic twisting produces a microstructural helix of easy magnetization direction. When exposed to a 200 oersted field at 60 Hz, processed wires produce a voltage signal which typically is from 10 to 100 millivolts per inch, and from 100 to 1000 millivolts per inch at frequencies of 60 to 100 kHz. Higher voltages are achievable by connecting magneto-electric pulse-generating elements in series, and parallel connecting can be used to increase current output.

Magneto-electric pickup elements as disclosed above are applicable in proximity, displacement, rotation, and frequency sensors and other switching and triggering devices. Furthermore, potential biomedical applications comprise the functional stimulation of nerves, brain functions, and neuromuscular activities, and the acceleration of healing of bone fractures. In cases where a pickup element is implanted in body tissue it is advantageous to encapsulate such element in a corrosion resistant and biomedically compatible coating such as, e.g., a coating of gold, platinum, teflon, or silicone.

EXAMPLE 1

An Fe-6 percent Ni wire was wire drawn resulting in 85 percent area reduction, heated at a temperature of 600 degrees C. for 16 hours, wire drawn resulting in 90 percent area reduction to a diameter of 0.01 inch, heated at a temperature of 500 degrees C. for 1 hour, and twisted to result in retained plastic deformation of ¼ turn per inch. A 4-inch long piece of this wire exposed to an alternating magnetic field of 200 oersteds at 60 Hz produced an end-to-end voltage of 210 millivolts; in a field of 400 oersteds at 100 kHz the voltage was 510 millivolts.

EXAMPLE 2

An Fe-12 percent Ni wire was swaged from a diameter of 0.5 inch to 0.265 inch diameter, heated at a temperature of 550 degrees C. for 1 hour, wire drawn to 0.015 inch diameter, and plastically twisted 4 turns per inch. A length of 2 inches of wire was placed in a magnetic field of 400 oersteds at 60 Hz, and a voltage of 40 millivolts was obtained between wire ends.

EXAMPLE 3

A wire sample was processed as in Example 2 above and then further processed by stress relief annealing at a temperature of 550 degrees C. for 30 minutes. A voltage of 43 millivolts was obtained between wire ends under test conditions as in Example 2.

EXAMPLE 4

A wire sample comprising 8 weight percent Ni, 2 weight percent Mn, and remainder essentially Fe was processed as described above in Example 2. A voltage of 22 millivolts was obtained under the same test conditions.

EXAMPLE 5

A wire sample comprising 3 weight percent Ni, 5 weight percent Cr, and remainder essentially Fe was processed by wire drawing from a diameter from 0.26 inch to 0.1 inch diameter. The drawn sample was heat treated at a temperature of 600 degrees C. for 16 hours, wire drawn to 0.01 inch diameter, heated at a temperature of 450 degrees C. for 15 minutes, and plastically twisted 1 turn per inch. A length of 5 inches of wire was placed in a 200 oersted field at 60 Hz, and a voltage of 105 millivolts was measured between wire ends.

What is claimed is:

1. Device comprising means for producing an electrical signal in response to a change in a magnetic field,
    said means comprising a body of a ferromagnetic alloy,
    said body having a major dimension in a direction which here is designated as a major axis,
    said body having electrical contact points which are spaced apart in a direction which has a substantial component in the direction of said major axis,
    the microstructure of said body comprising a 2-phase decomposed microstructure comprising elongated, substantially aligned particles which are helically arranged in the absence of externally applied elastic stress, the helical axis having a substantial component in the direction of said major axis.

2. Device of claim 1 in which a voltage of at least 10 millivolts is obtained per inch distance between said points upon exposure of at least a portion of said body to an alternating magnetic field having a strength of 200 oersteds and a frequency of 60 Hz.

3. Device of claim 1 in which said body comprises Fe and Ni in a combined amount of at least 90 weight percent of said body.

4. Device of claim 3 in which Ni is comprised in said body in an amount in the range of from 2 to 18 weight percent of said combined amount.

5. Device of claim 1 in which said permanently present helical microstructure has 0.1 to 10 turns per inch.

6. Device of claim 1 in which said body is designed for medical implantation.

7. Device of claim 6 in which said body has a biomedically compatible coating.

8. Method of producing an electrical signal inside an organism,
    said method comprising implanting an elongated body of a ferromagnetic alloy in said organism,
    said body having a major dimension in a direction which here is designated as a major axis,
    said body having electrical contact points which are spaced apart in a direction which has a substantial component in the direction of said major axis,
    the microstructure of said body comprising a 2-phase decomposed microstructure comprising elongated, subtantially aligned particles which are helically arranged in the absence of externally applied elastic stress, the helical axis having a substantial component in the direction of said major axis,
    said method comprising changing a magnetic field external to said organism to produce an electrical signal between said contacts, and
    said method comprising utilizing said electrical signal between said contact points.

9. Method of claim 8 in which said electrical signal is utilized for functional stimulation.

10. Method of claim 8 in which said electrical signal is utilized to accelerate bone healing.

* * * * *